US005493240A

United States Patent [19]

Frank

[11] Patent Number: 5,493,240
[45] Date of Patent: Feb. 20, 1996

[54] STATIC COMBINATORIAL LOGIC CIRCUITS FOR REVERSIBLE COMPUTATION

[75] Inventor: David J. Frank, Yorktown Heights, N.Y.

[73] Assignee: International Business Machines Corporation, Armonk, N.Y.

[21] Appl. No.: 397,007

[22] Filed: Mar. 1, 1995

[51] Int. Cl.$^6$ .................................................. H03K 19/00
[52] U.S. Cl. ................................ 326/98; 326/21; 326/93
[58] Field of Search .................................... 326/21, 93, 98

[56] References Cited

U.S. PATENT DOCUMENTS

| | | | |
|---|---|---|---|
| 3,980,897 | 9/1976 | Arnold | 307/205 |
| 4,707,620 | 11/1987 | Sullivan et al. | 307/270 |
| 5,134,320 | 7/1992 | Perusse | 307/571 |
| 5,175,447 | 12/1992 | Kawasaki et al. | 307/480 |
| 5,241,221 | 8/1993 | Fletcher et al. | 307/263 |
| 5,378,940 | 1/1995 | Knight, Jr. et al. | 326/98 X |
| 5,396,527 | 3/1995 | Schlecht et al. | 326/93 X |

OTHER PUBLICATIONS

Koller et al, "Adiabatic Switching, Low Energy Computing, and the Physics of Storing and Erasing Information", in *Proceedings of Computation Workshop*, Dallas, Texas, Oct. 1992, pp. 1–5.

Merkle, "Reversible Electronic Logic Using Switches", submitted to *Nanotechnology*, 1992, p. 1–31.

Seitz et al, "Hot–Clock nMOS", *Proceedings of the 1985 Chapel Hill Conference on VLSI*, Computer Science Press, 1985.

Mead & Conway, *Introduction to VLSI Systems*, Addison–Wesley Publishing Co., Reading, Mass. Oct. 1980, pp. 348–351.

An Electroid Switching Model For Reversible Computer Architectures. J. Storrs Hall, Oct. 2, 1992, Proc. Workshop on Physics and Comp., IEEE Comp. Soc. Press, 1993, p. 237.

Notes on The History of Reversible Computation, C. H. Bennett, IBM Journal of Research and Development, 32 p. 16, 1988.

*Primary Examiner*—David R. Hudspeth
*Attorney, Agent, or Firm*—Perman & Green

[57] ABSTRACT

A combinational logic circuit composed of FETs connected together to perform a dual-rail combinatorial logic function, in which one portion of the circuitry is an original logic circuit portion that is connected to a variable power source and creates the desired logic function, and the remaining portion of the circuit is a complement logic circuit portion that is connected a constant power source and creates the complementary logic function. The two portions of the circuitry are connected together in combination at the output to form a dual-rail output signal useful for reversible computation.

13 Claims, 5 Drawing Sheets

STATIC COMBINATORIAL LOGIC CIRCUITS FOR REVERSIBLE COMPUTATION

BACKGROUND OF THE INVENTION

1. Field of the Invention

The present invention relates to circuits for reversible computation, and more particularly to a static combinatorial adiabatic switching CMOS logic structure for reversible computation.

2. Description of the Background Art

U.S. Pat. No. 5,241,221, issued Aug. 31, 1993 to Fletcher et al entitled "CMOS DRIVER CIRCUIT HAVING REDUCED SWITCHING NOISE" discloses a driver circuit wherein high and low impedance drive means respond to a threshold value of the output signal and turn off the low-impedance drive means in the course of the output transition. The low initial output impedance of the driver circuit effects rapid charging of a line capacitance, while toward the end of the output transition the higher output impedance of the driver circuit more closely matches the input impedance of a load circuit. This higher impedance dampens ringing and thereby reduces induced supply line noise which is conventionally associated with high-speed driver circuits.

U.S. Pat. No. 5,175,447 issued Dec. 29, 1992 to Kawaski et al entitled "MULTIFUNCTIONAL SCAN FLIP-FLOP" discloses a multifunctional scan flip-flop having a normal function and a scan function, including: a first latch used for a normal function for latching input data applied to a data input terminal during a normal function operation, the latch operation being carried out synchronous with a clock applied to a clock input terminal; a second latch used for a scan function for holding scan data applied to a scan data input terminal during a scan function operation; and a delay circuit for delaying one of the input data and the clock relative to the other, the delay operation being carried out in accordance with the H/L level of the scan data held by the second latch.

U.S. Pat. No. 5,134,320 issued Jul. 28, 1992 to Perusse entitled "HIGH EFFICIENCY FET DRIVER WITH ENERGY RECOVERY" discloses a circuit incorporating a circuit element for recovering the energy stored in the parasitic input capacitance of a power transistor at turn-on. The circuit includes a resonating element, such as a transformer, and a diode coupled between a voltage source and a power transistor, such as a field effect transistor. The diode is adapted to avoid loading of the power source. The energy is recovered and stored until a new turn-on interval is required or until there is a need for other power requirements. This improves the operating efficiency of a system using the circuit. For a given loss, the recovery of this energy permits operation at a higher frequency or size reduction and/or improved performance, or the use of large die for reduced conduction loss. The advantages are the same for FETs when they are used as the control element or as a rectifier element, but the gains in efficiency are most notable in rectifier applications.

U.S. Pat. No. 4,707,620 issued Nov. 17, 1987 to Sullivan et al. entitled "ADJUSTABLE IMPEDANCE DRIVER NETWORK" discloses a variable impedance driver network that comprises a plurality of transmission gates connected in parallel between a voltage source and an output. Each transmission gate has a predetermined nominal impedance and by turning on selective gates the overall impedance of the network may be adjusted to match that required at the output.

U.S. Pat. No. 3,980,897 issued Sept. 14, 1976 to Arnold entitled "LOGIC GATING SYSTEM AND METHOD" discloses a circuit arrangement that has a first subset of semiconductor devices, an associated first additional device and a first gate output. A second subset of semiconductor devices has an associated second additional device and a second gate output. The first and second subsets are of one conductivity type while the first and second additional devices are of another conductivity type. First logic signals are applied to the first subset for turning on the first subset and the first additional device for producing at the first gate output a first function of the first logic signals. Second logic signals are applied to the second subset for turning on the second subset and the second additional device for producing at the second gate output a second function of the second logic signals.

The publication "An Electroid Switching Model For Reversible Computer Architectures," by J. S. Hall, Proc. Workshop on Physics and Computation, Oct. 1992 (IEEE Comp. Soc. Press, 1993, p. 237 describes electronic implementations using adiabatic switching and "electroid switches".

SUMMARY OF THE INVENTION

An object of the present invention is to provide a static combinatorial switching structure for reversible computation;

Another object of the present invention is to provide a static combinatorial adiabatic switching structure including CMOS logic switching circuits for reversible computation;

A further object of the present invention is to provide a static circuit for reversible computation using dual rail, double-transmission gate logic and its dual complement for reduced power requirements;

Still another object of the present invention is to provide a combinatorial logic circuit having a first logic circuit connected to a variable power source in combination with a second logic circuit complementary to the first logic circuit and connected to a constant power source.

Other and further features, advantages and benefits of the invention will become apparent in the following description taken in conjunction with the following drawings. It is to be understood that the foregoing general description and the following detailed description are exemplary and explanatory but are not to be restrictive of the invention. The accompanying drawings which are incorporated in and constitute a part of this invention and, together with the description, serve to explain the principles of the invention in general terms. Like numerals refer to like parts throughout the disclosure.

DETAILED DESCRIPTION OF THE PREFERRED EMBODIMENT

The techniques for reversible computation have been known in the art. Descriptions of some known techniques are disclosed in the publication by C. H. Bennett, "Notes on The History of Reversible Computation", IBM Journal of Research and Development, 32, page 16, (1988). In reversible computation, the energy dissipation required to erase data is avoided by saving the intermediate data until a later time when the computation, or a subset of it, can be run backwards and the data can be dissipationlessly uncomputed. Most of the proposed implementations to date have been impractical. Recently, electronic implementations have been described using adiabatic switching and "electroid switches" in the publication by J. S. Hall, "An Electroid Switching model for Reversible Computer Architectures," Proc. Workshop on Physics and Computation, Oct. 1992 (IEEE Comp. Soc. Press, 1993, p. 237, which publication is incorporated herein by reference.

There is a growing demand for low power, high performance electronics, especially for battery-powered applications. One possible way of addressing this demand is through the use of adiabatic switching techniques combined with reversible computing schemes. In adiabatic switching, the voltage is the same on both sides of a switch before the switch is closed. The most readily apparent advantage of adiabatic switching techniques combined with reversible computing schemes is that the energy consumption per switching operation decreases as the duration of the switching event increases, unlike conventional CMOS circuits, in which the energy per switching event remains essentially constant.

These electronic ideas can readily be implemented in CMOS by using dual-rail logic and dual bi-directional CMOS switches for the 'electroid switches.' Reversible computation using adiabatic switching has been described in the Hall Publication in a dynamic form, in which the nodes are left floating when not attached to a clock supply. This may be acceptable for some circuits, but it does require periodic use or refreshing of the nodes, since otherwise leakage currents would tend to discharge the node capacitances, leading to incorrect logic states. For combinatorial logic circuits for which periodic use or refresh are either not feasible or not practical, the present invention provides static logic circuits.

Figure 1:
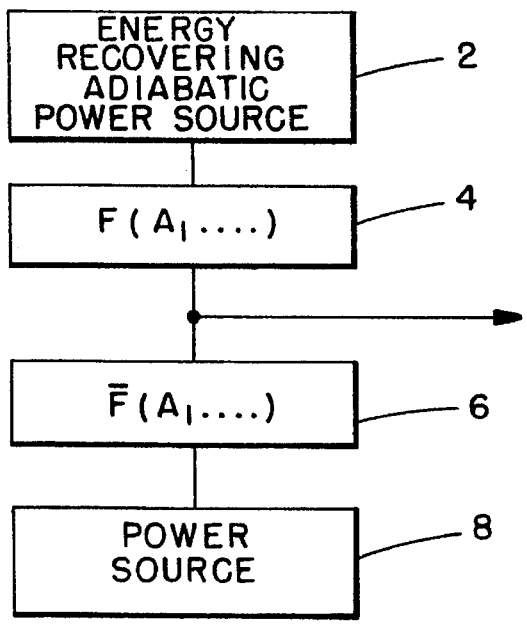
FIG. 1 is a schematic block diagram illustrating functional components used in the present invention.

FIG. 1 is a schematic block diagram illustrating the elements of the present invention. In FIG. 1 block 4 is an original logic circuit for carrying out a logic function F for logic input signals $A_1$ through $A_n$. Block 6 is a logic block of the dual, or complement function $\bar{F}$ of the original logic circuit for the logic input signals $A_1$ through $A_n$.

Block 2 is a first, energy-recovering adiabatic power source and block 8 is a second power source. First power source 2 may be, for example, an actual energy recovering supply such as described in the publication by L. J. Svensson et al., entitled "Adiabatic charging without inductors", IWLPD '94 Workshop Proceedings, pp. 159–164 and in the publication by Charles L. Seitz et al., entitled "Hot-Clock nMOS", 1985 Chapel Hill Conf. on VLSI, published by Conf. Sci. Press, pp. 1–17, which publications are incorporated herein by reference.

Block 8 is a second power source that may be either a D.C. source as a preferred embodiment or an energy recovery source such as the power source of Block 2.

Figure 2:
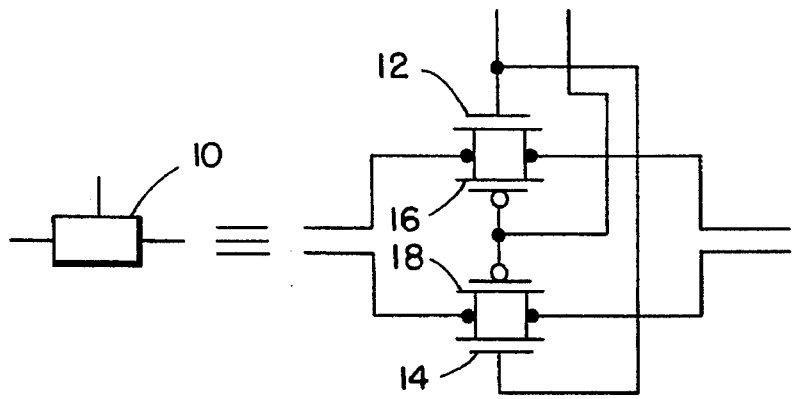
FIG. 2 is a schematic illustration of a symbol for the interconnection of four FETs as used in the circuits of FIGS. 3 through 9.

For purposes of explanation of the static combinatorial switching logic of the present invention, a dynamic implementation is first discussed. Dynamic reversible dual-rail combinatorial logic can be constructed from CMOS bi-directional FET switches shown in the figures by symbols for electroid switches. FIG. 2 illustrates that an electroid switch symbol 10 is the equivalent of four FETs, two n FETs 12 and 14 and two p FETs 16 and 18.

Figure 3:
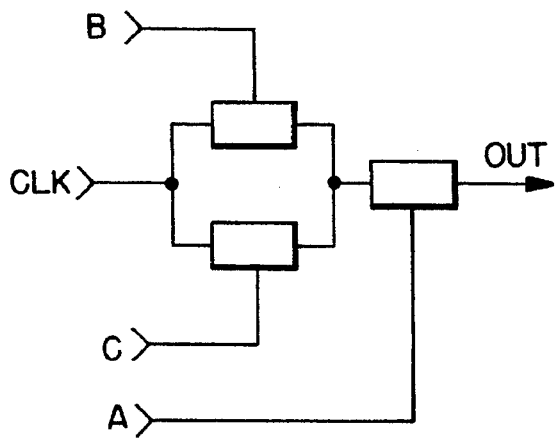
FIG. 3 is a schematic illustration of a dynamic reversible, dual-rail combination logic circuit according to the prior art.

FIG. 3 illustrates a dynamic reversible dual-rail combinatorial logic circuit for the logic function A×(B+C). Each of the wires shown in FIG. 3 represents two wires for the two rails of the dual rail logic. The circuit of FIG. 3 is based directly on the "electroid" logic discussed in the Hall publication. In FIG. 3, when input A is "1" and either B or C are "1" the clock input signal CLK passes through to the output. Otherwise, the output is floating, being disconnected from the clock signal. It should be noted that the logic state "1" is the voltage state (Vdd,O) on the dual-rail pair of wires while the logic state "0" is the voltage state (O,Vdd) on the paired wires. The CLK input signal is understood to include its complement $\overline{CLK}$ on the second rail.

Figure 4:
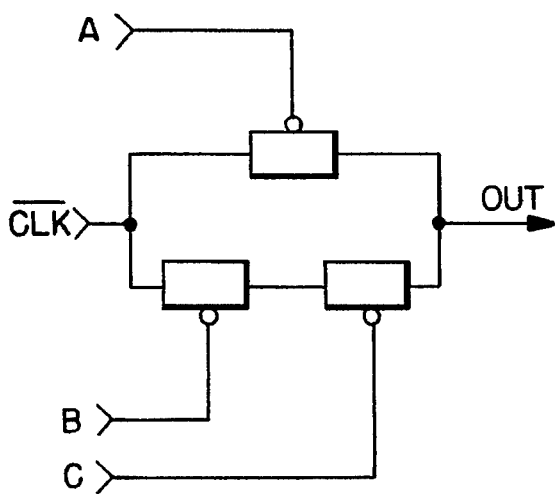
FIG. 4 is a schematic illustration of a circuit that is the complement of the circuit shown in FIG. 3.

In the dual-rail circuit of FIG. 3, the inversion, indicated by the small circles is available by switching the rails. Thus, the dual, or complement logic combination can be used to provide this logic function as shown in FIG. 4. This was not taught in the Hall publication. The circuits of FIG. 3 and 4 both have the same outputs when CLK is active or high, but their default states when CLK is not active are different the circuit of FIG. 3 defaults to the "0" state, whereas the circuit of FIG. 4 defaults to the "1" state. It is to be noted that when CLK rather than $\overline{CLK}$ is applied to the circuit of FIG. 4, the complement of the original logic function will be obtained, with a default state of "0".

Figure 5:
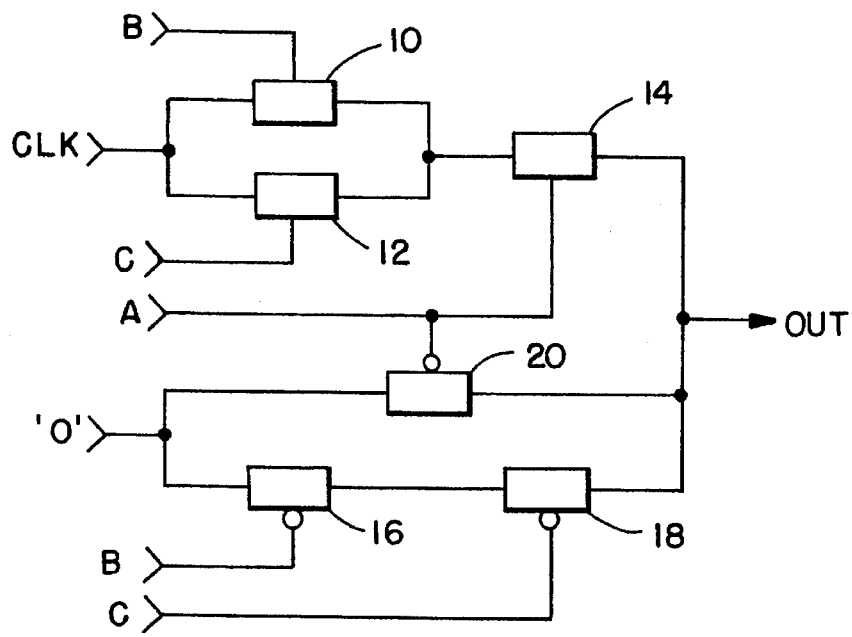
FIG. 5 is a schematic illustration of a static logic circuit for reversible computation according to the principles of the present invention.

In the present invention, an original logic circuit and its dual logic circuit, or complement, are used together in combination to provide static operation. The original logic circuit is connected to a clock, or driven data line that is a variable (AC) first power signal, however, the complement logic circuit is connected to a constant (DC) power supply signal rather than a clock. The outputs of the original logic and complement logic circuits are connected together as shown in FIG. 5 for the aforesaid logic function example A×(B+C) where electroid switches 10 and 12 are connected in parallel to CLK and logic inputs B and C, and then in series with electroid switch 14 which is connected to logic input A. In the complement portion electroid switches 16 and 18 are connected in series and to logic inputs $\bar{B}$ and $\bar{C}$ respectively. Electroid switch 20 is connected to logic input $\bar{A}$ and in parallel with electroid switches 16 and 18 to "0". In FIG. 5, when A×(B+C)="1", the output is driven by the input clock CLK though devices 10, 12 and 14 and when A×(B+C)="0" the output is held at "0" by devices 16, 18 and 20. This technique will function for any combinational logic function. When used for switching in adiabatic circuit arrangements the original logic circuit portion is connected to the AC supply as CLK and the complement circuit portion is connected to the DC supply as the "0" input.

Figure 6:
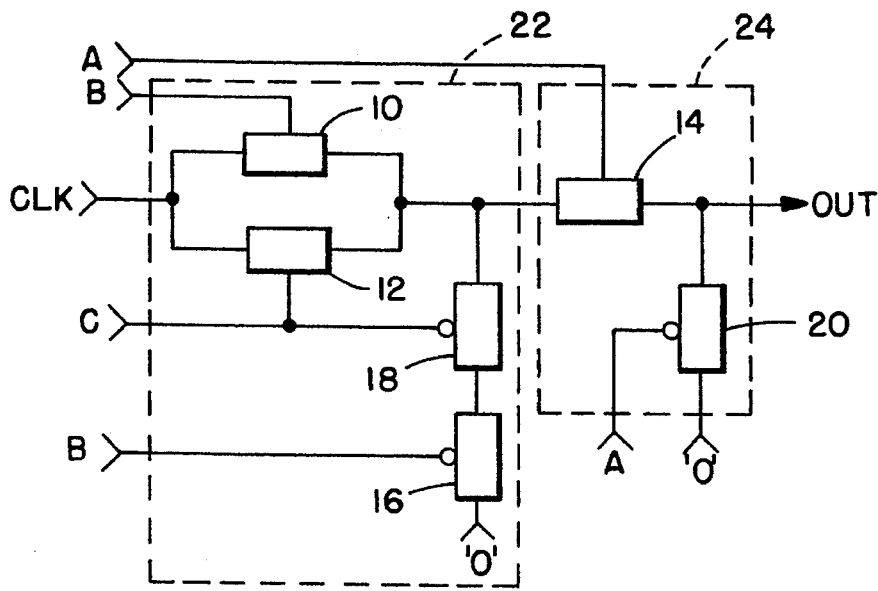
FIG. 6 is a schematic illustration of a circuit that merges the logic combination of FIG. 5 and its complement function.

FIG. 6 is a different implementation of the same logic function as in FIG. 5. In this case the function A×(B+C) is evaluated in two parts. First, (B+C) is evaluated by block 22, which consists of electroid switches 10, 12, 16 and 18. (This OR function is the same as FIG. 8A.) Then, the AND A is evaluated by block 24, which contains electroid switches 14 and 20. This block is a buffer that uses the (B+C) signal as its clock input and passes the (B+C) signal through to the output when A='1' but maintains a '0' on the output when A='0'.

Thus, according to the present invention, a static combinatorial switching logic circuit for reversible computation is provided wherein a first, original logic circuit portion including a plurality of electroid logic switches is connected a first power source such as an AC supply signal. A second logic circuit portion that is the logical complement of the original logic circuit portion is connected to the first logic circuit portion and to a second power source such as a DC power supply. The first and second logic circuit portions are connected to selected logic input signals to provide a combined output logic function signal.

The present invention, as previously stated, is not limited to the A×(B+C) logic function of the embodiments of FIGS. 5 and 6, but is useful for any combinatorial logic function.

Figure 7A:
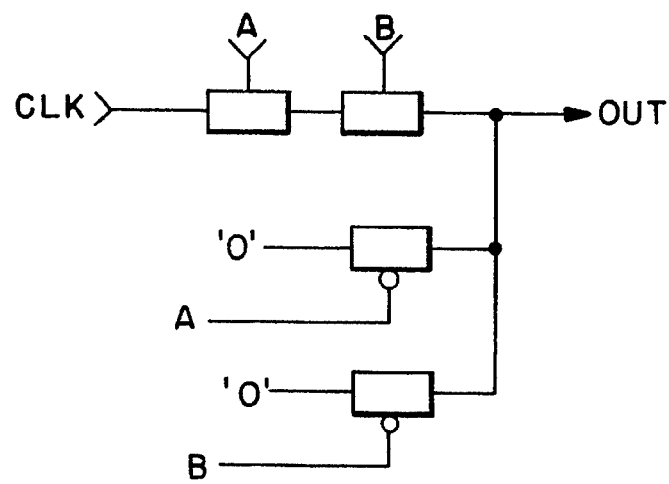
FIGS. 7A, 7B, 7C, and 7D, 8A, 8B, 8C, 9A, and 9B are schematic illustrations of the circuit of FIG. 1 for use for particular logic cases.
Figure 7B:
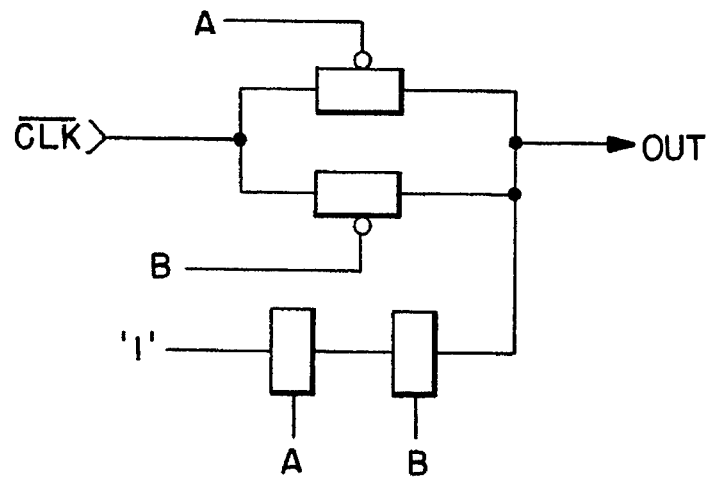
Figure 7C:
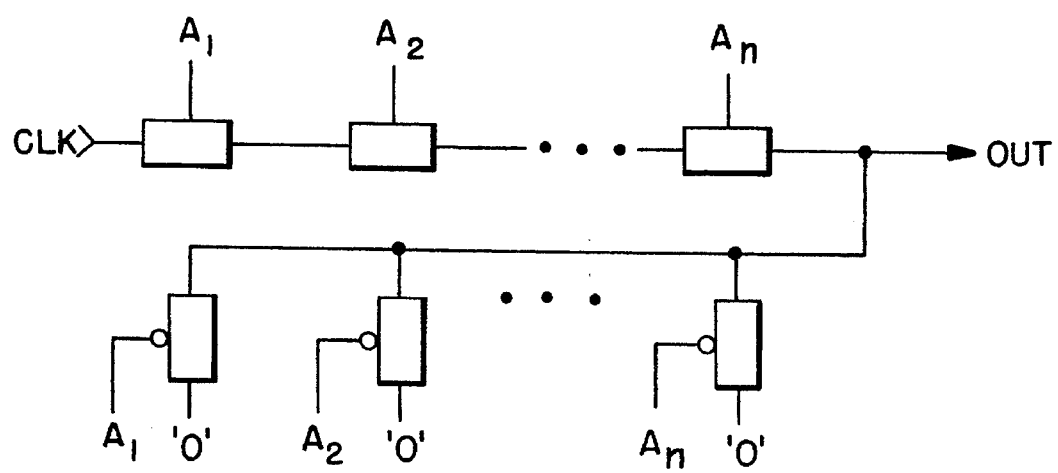
Figure 7D:
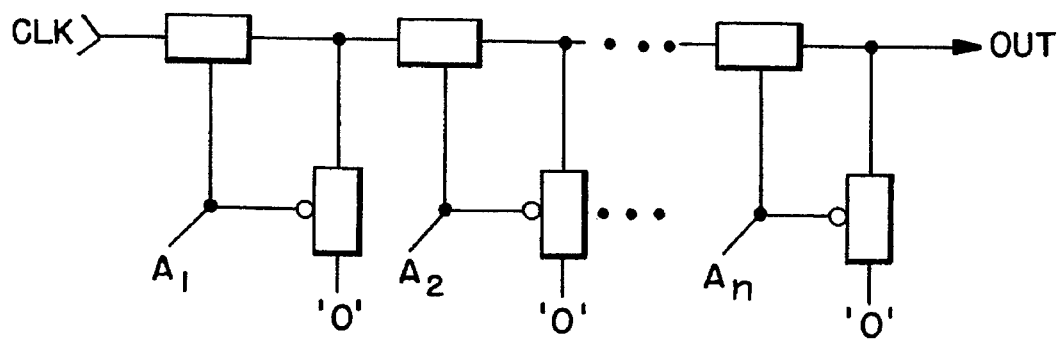

FIGS. 7A, 7B, 7C and 7D illustrate embodiments of the present invention for use as AND circuits. FIG. 7A is a two input AND circuit with a default "0". FIG. 7B is a two input AND circuit with a default "1". FIG. 7C is a multiple input AND circuit with a default "0" and FIG. 7D is an alternate multiple input AND circuit with a default "0" in which the inputs are processed separately by buffers similar to block 24 in FIG. 6.

Figure 8A:
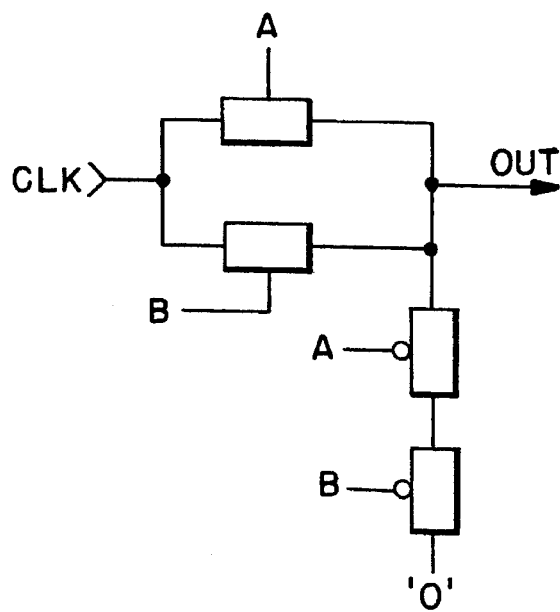
Figure 8C:
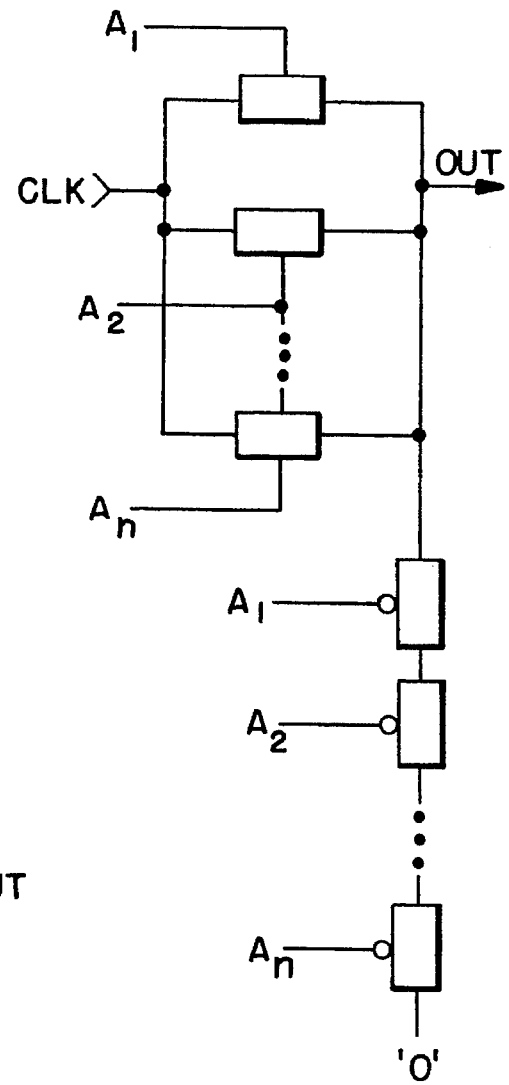
Figure 8B:
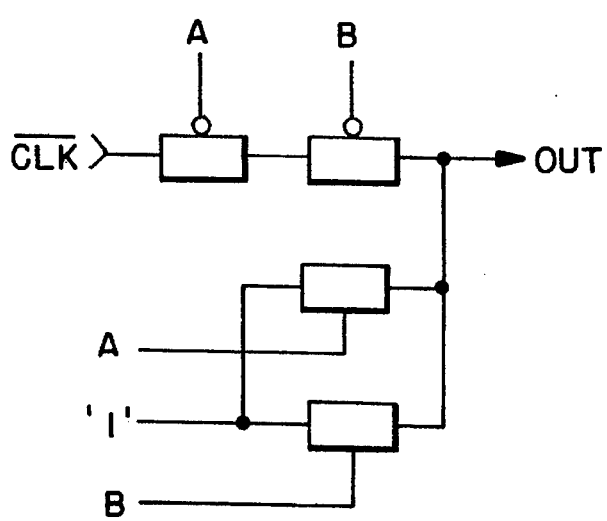

FIGS. 8A, 8B and 8C illustrate embodiments of the OR circuits. FIG. 8A is a two input OR circuit with a default "0" FIG. 8B is a two input OR circuit with a default "1" and FIG. 8C is a multiple input OR circuit with a default "0".

Figure 9A:
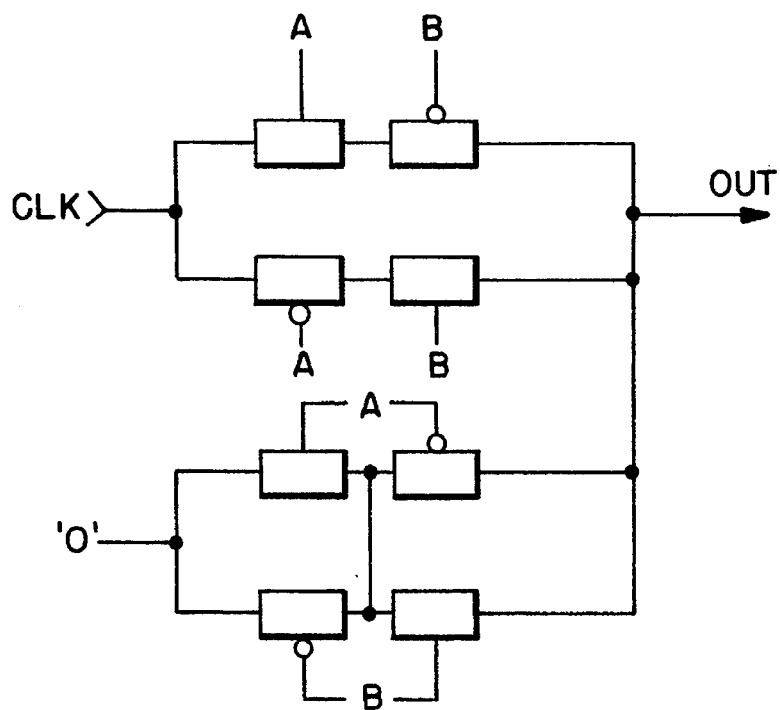
Figure 9B:
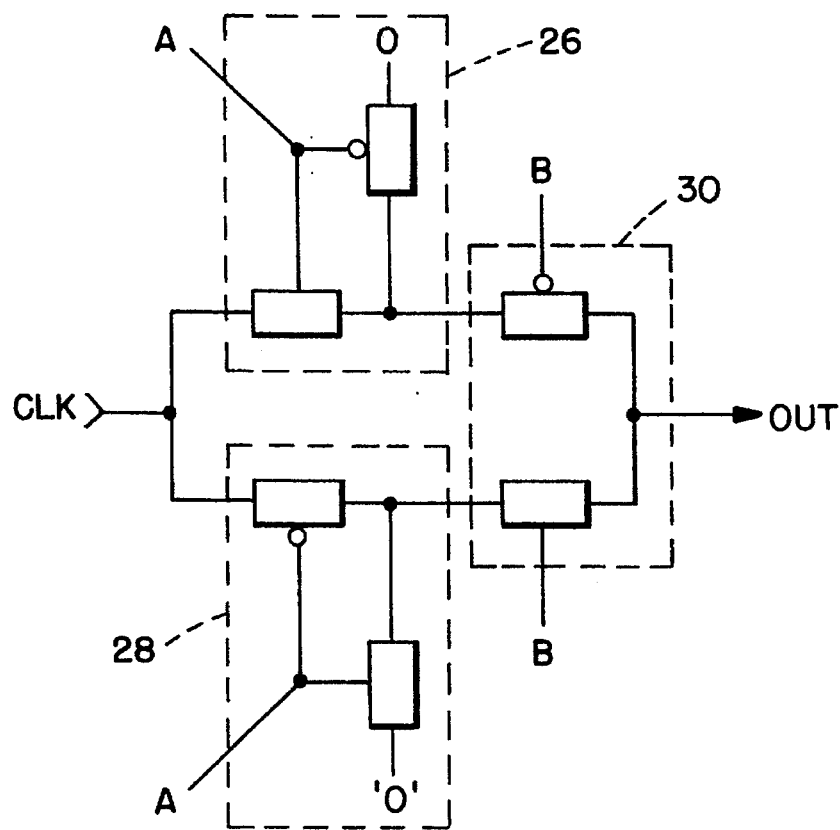

FIG. 9A is an embodiment of the present invention used as a two input exclusive OR (XOR) circuit with a default "0" and FIG. 9B is also an embodiment used as a two input exclusive OR with default "0" but with a different decomposition of the logic function such that the complement is in effect merged into the logic function. FIG. 9B is an example of an embodiment wherein a second power source is an adiabatic power source. Using a single adiabatic power source and a DC power source, the A and Ā buffers, 26 and 28, create two adiabatic clock signals. The B, B̄ stage 30 uses these two adiabatic signals as power sources to create the final output A XOR B. The first and second power sources must be in the same state, for example "O" while the inputs A1 —An are being changed. The circuit arrangements for the default "1" cases of multiple input OR, two input XOR and two input XOR with merged complement are not shown but can be derived from the examples shown.

What has been described are logic circuits composed of FETs connected together in such a way as to perform a dual-rail combinatorial logic function, in which one portion of the circuitry is connected to a variable power source and creates the desired logic function, and the remaining portion of the circuitry is connected to a constant power source and creates the complementary logic function, and wherein the two portions of the circuitry are connected in combination to form the dual-rail output signal.

The logic circuits are applicable for reversible computation and are potentially useful for any application for which energy consumption must be kept very low.

Examples are battery powered applications, space applications, and possibly large, dense system applications in which heat removal is a problem.

While preferred embodiments of the invention have been disclosed in detail, it should be understood by those skilled in the art that various other modifications may be made to the illustrated embodiments without departing from the scope of the invention as described in the specification and defined in the appended claims.

I claim:

1. A static combinatorial switching logic circuit comprising:

a first power source for providing a first power signal, a second power source for providing a second power signal, wherein at least one of said first and second power signals is an AC signal, a source of a plurality of logic signals, a first logic circuit connected to said first power source and to said source of said plurality of logic signals for providing a first output signal that is a logic combination signal, and a second logic circuit connected to said second power source and to said source of said plurality of said logic signals for providing a second output signal that is a logic combination signal, said second output logic combination signal being the logical complement of said first output logic combination signal, and means connected to said first and second logic circuits for combining said first and second output logic combination signals.

2. A static combinatorial switching logic circuit according to claim 1 wherein said first power source is a source of a variable AC first power signal and wherein said second power source is a source of a constant DC second power signal.

3. A static combinatorial switching logic circuit according to claim 1 wherein said first and second power sources are sources of a variable AC signal.

4. A static combinatorial switching logic circuit according to claim 1 wherein said first power source is an energy-recovering adiabatic power source.

5. A static combinatorial switching logic circuit according to claim 4 wherein said energy-recovering adiabatic power source is a separate energy-recovering combinatorial switching logic circuit.

6. A static combinatorial switching logic circuit according to claim 1 wherein said first and second power sources are energy-recovering adiabatic power sources.

7. A static combinatorial switching logic circuit according to claim 6 wherein one of said energy-recovering adiabatic power sources is a separate energy-recovering combinatorial switching logic circuit.

8. A static combinatorial switching logic circuit according to claim 1 wherein said first logic circuit includes a plurality of electroid switches, each connected to separate ones of said logic signals, and wherein said second logic circuit includes a plurality of electroid switches, each connected to separate ones of said logic signals.

9. A static combinatorial switching logic circuit according to claim 8 wherein each of said electroid switches includes a first pair of field effect transistors connected in parallel with each other and to said source of logic signals and a second pair of field effect transistors connected in parallel with each other and to said source of logic signals and wherein said first and second pairs of parallel connected field effect transistors operate in parallel to provide dual rail output leads.

10. A static combinatorial switching logic circuit according to claim 9 wherein said first pair of field effect transistors and said second pair of field effect transistors of said electroid switches each include an n channel FET transistor connected in parallel to a p channel FET transistor to provide a CMOS bi-directional switch.

11. A static combinatorial switching logic circuit according to claim 10 wherein said first logic circuit comprises a first plurality of said electroid switches connected in series to an AC first power signal from said first power source, and wherein said second logic circuit comprise a second plurality of said electroid switches connected in parallel to a DC second power signal from said second power source.

12. A static combinatorial switching logic circuit according to claim 10 wherein said first logic circuit comprises a first plurality of said electroid switches connected in parallel to an AC first power signal from said first power source, and wherein said second logic circuit comprises a second plurality of said electroid switches connected in series to a DC second power signal from said second power source.

13. A static combinatorial switching logic circuit according to claim 10 wherein said first logic circuit and said second logic circuit each comprise a first subcombination of the electroid switches connected in series, and a second subcombination of electroid switches connected in series, said first and second subcombination of electroid switches being connected in parallel.

* * * * *